(12) United States Patent
Van Duren et al.

(10) Patent No.: US 9,466,499 B2
(45) Date of Patent: Oct. 11, 2016

(54) COMBINATORIAL METHODS FOR DEVELOPING ELECTROCHROMIC MATERIALS AND DEVICES

(71) Applicant: Intermolecular, Inc., San Jose, CA (US)

(72) Inventors: Jeroen Van Duren, Palo Alto, CA (US); Minh Huu Le, San Jose, CA (US); Minh Anh Nguyen, San Jose, CA (US); Sandeep Nijhawan, Los Altos, CA (US)

(73) Assignee: Intermolecular, Inc., San Jose, CA (US)

( * ) Notice: Subject to any disclaimer, the term of this patent is extended or adjusted under 35 U.S.C. 154(b) by 376 days.

(21) Appl. No.: 14/142,121

(22) Filed: Dec. 27, 2013

(65) Prior Publication Data

US 2014/0272112 A1 Sep. 18, 2014

Related U.S. Application Data

(60) Provisional application No. 61/780,128, filed on Mar. 13, 2013.

(51) Int. Cl.
*B05D 5/06* (2006.01)
*H01L 21/30* (2006.01)
(Continued)

(52) U.S. Cl.
CPC ............ *H01L 21/30* (2013.01); *B01J 19/0046* (2013.01); *B08B 3/04* (2013.01); *C23C 14/08* (2013.01); *C23C 14/22* (2013.01); *C23C 14/34* (2013.01); *C23C 18/1619* (2013.01); *C23C 18/1682* (2013.01); *C25D 17/02* (2013.01); *G11C 13/0004* (2013.01); *H01L 21/02104* (2013.01); *H01L 21/30604* (2013.01); *H01L 21/6719* (2013.01); *H01L 21/67051* (2013.01); *H01L 21/67057* (2013.01); *H01L 22/10* (2013.01); *H01L 22/12* (2013.01); *H01L 22/14* (2013.01); *H01L 27/2463* (2013.01); *H01L 45/1608* (2013.01); *B01J 2219/0038* (2013.01);
(Continued)

(58) Field of Classification Search
CPC ........................................................ B05D 5/06
See application file for complete search history.

(56) References Cited

U.S. PATENT DOCUMENTS 5,657,150 A * 8/1997 Kallman ............... G02C 7/101
351/49
2007/0056851 A1 3/2007 Owen
(Continued)

FOREIGN PATENT DOCUMENTS

| EP | 1588157 A1 | 10/2005 |
|---|---|---|
| WO | 2004063742 A1 | 7/2004 |
| WO | 2011050291 A2 | 4/2011 |

OTHER PUBLICATIONS

Liu, Shaoqin, et al., "A Thin-Film Electrochromic Device Based on a Polyoxometalate Cluster". Advanced Materials, 2002, 14, No. 3, Feb. 5, pp. 225-228.*

(Continued)

*Primary Examiner* — Bret Chen

(57) ABSTRACT

A substrate having a plurality of site-isolated regions defined thereon is provided. A first electrochromic material, or a first electrochromic device stack, is formed above a first of the plurality of site-isolated regions using a first set of processing conditions. A second electrochromic material, or a second electrochromic device stack, is formed above a second of the plurality of site-isolated regions using a second set of processing conditions. The second set of processing conditions is different than the first set of processing conditions.

11 Claims, 10 Drawing Sheets

(51) Int. Cl.

| | |
|---|---|
| *B08B 3/04* | (2006.01) |
| *G11C 13/00* | (2006.01) |
| *H01L 27/24* | (2006.01) |
| *C23C 14/08* | (2006.01) |
| *C23C 14/22* | (2006.01) |
| *C23C 14/34* | (2006.01) |
| *H01L 21/02* | (2006.01) |
| *H01L 21/66* | (2006.01) |
| *H01L 45/00* | (2006.01) |
| *H01L 21/306* | (2006.01) |
| *H01L 21/67* | (2006.01) |
| *C23C 18/16* | (2006.01) |
| *C25D 17/02* | (2006.01) |
| *B01J 19/00* | (2006.01) |

(52) U.S. Cl.
CPC ............... *B01J2219/00283* (2013.01); *B01J 2219/00286* (2013.01); *B01J 2219/00301* (2013.01); *B01J 2219/00313* (2013.01); *B01J 2219/00382* (2013.01); *B01J 2219/00416* (2013.01); *B01J 2219/00418* (2013.01); *B01J 2219/00527* (2013.01); *B01J 2219/00585* (2013.01)

(56) References Cited

U.S. PATENT DOCUMENTS

| | | | |
|---|---|---|---|
| 2007/0247999 A1* | 10/2007 | Mukoh | G11B 7/24038 369/276 |
| 2011/0260961 A1* | 10/2011 | Burdis | G02F 1/1523 345/156 |
| 2011/0279141 A1 | 11/2011 | Wang et al. | |
| 2012/0218621 A1 | 8/2012 | Kwak et al. | |
| 2013/0258436 A1* | 10/2013 | Podbelski | G02F 1/157 359/265 |

OTHER PUBLICATIONS

Mortimer, Roger, J., et al., "Electrochromic Materials". Annu. Rev. Mater. Res. 2011. 41:241-68.*

Nikolou, Maria, et al., "Dual n- and p- Type Dopable Electrochromic Devices Employing Transparent Carbon Nanotube Electrodes". Chemistry of Materials, DOI:10.1021/cm902768q, pp. 1-9.*

Mortimer, Roger, J., et al., "Electrochromic organic and polymeric materials for display applications." Displays 27 (2006) 2-18.*

Polat, Emre O., et al., "Graphene based flexible electrochromic devices". Scientific Reports, 4: 6484 DOI:10.1038/srep06484, pp. 1-9.*

\* cited by examiner

COMBINATORIAL METHODS FOR DEVELOPING ELECTROCHROMIC MATERIALS AND DEVICES

CROSS-REFERENCE TO RELATED APPLICATION

This application claims priority to U.S. Provisional Patent Application No. 61/780,128, filed Mar. 13, 2013, entitled "HPC Methods for Processing Materials," which is incorporated by reference herein in its entirety for all purposes.

TECHNICAL FIELD

The present invention relates to electrochromic materials and devices. More particularly, this invention relates to methods and systems for developing electrochromic materials and devices in a combinatorial manner.

BACKGROUND OF THE INVENTION

Combinatorial processing enables rapid evaluation of, for example, semiconductor and solar processing operations. The systems supporting the combinatorial processing are flexible to accommodate the demands for running the different processes either in parallel, serial or some combination of the two.

Some exemplary processing operations include operations for adding (depositions) and removing layers (etch), defining features, preparing layers (e.g., cleans), conversion of layers or surfaces, doping, etc. Similar processing techniques apply to the manufacture of integrated circuit (IC) semiconductor devices, flat panel displays, switching devices like transistors or amorphous metal nonlinear resistor devices, optoelectronics devices, light-emitting devices, photovoltaic devices, thermoelectric devices, electrochromic devices, energy storage devices, energy efficiency coatings, haptic devices like touch screen devices, communication devices, wearable electronic devices, data storage devices, magneto electronic devices, magneto optic devices, packaged devices, and the like. As manufacturing processes continue to increase in complexity, improvements, whether in materials, unit processes, or process sequences, are continually being sought for the multi-step processing sequence.

However, semiconductor, thin-film-coating, architectural glass coating, and solar companies conduct research and development (R&D) on full wafer and (glass) substrate processing through the use of split lots, as the conventional deposition, etch, pattern, and conversion systems are designed to support this processing scheme. This approach has resulted in ever escalating R&D costs and the inability to conduct extensive experimentation in a timely and cost effective manner. Combinatorial processing as applied to semiconductor, solar, energy storage, lighting, display, haptics, or energy-efficiency manufacturing operations enables multiple experiments to be performed at one time in a high throughput manner. Equipment for performing the combinatorial processing and characterization must support the efficiency offered through the combinatorial processing operations. The debottlenecking of the R&D efforts involves the above fast processing platforms in combination with throughput-matched characterization and fast automated data capture and analysis, in addition to accelerated lifetime testing and product simulations to allow a fast guidance for subsequent design of experiments to unravel the correlations between materials, processing, equipment, and product performance and durability.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
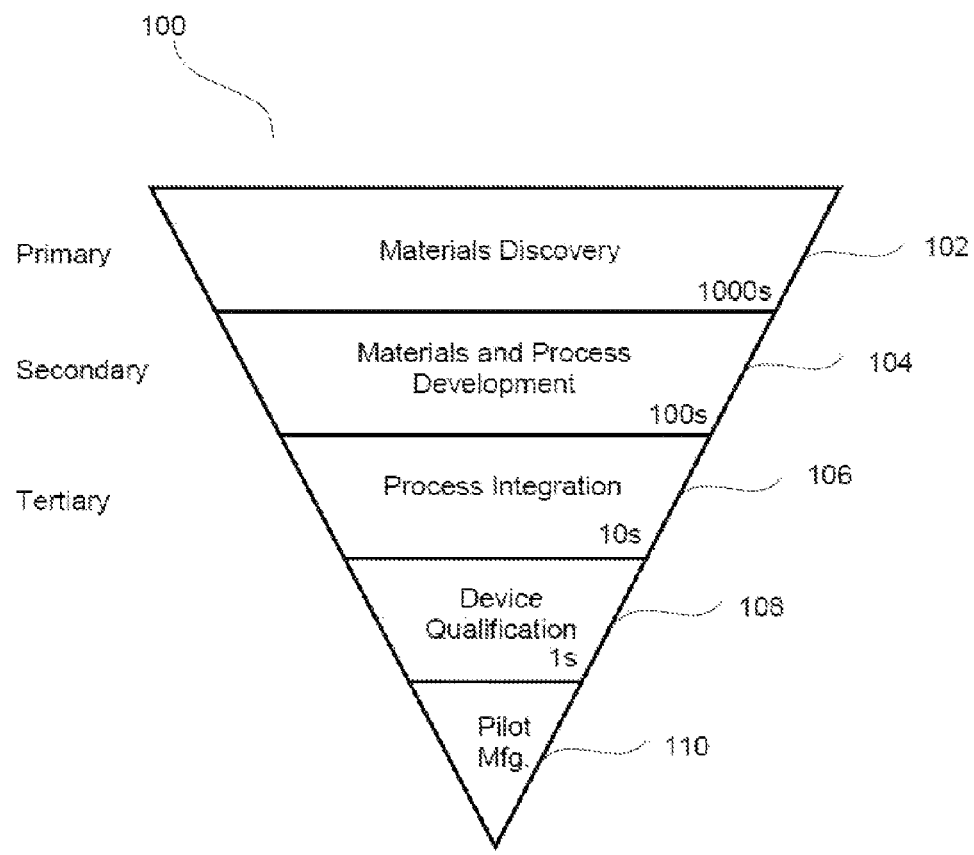
FIG. 1 illustrates a schematic diagram for implementing combinatorial processing and evaluation using primary, secondary, and tertiary screening.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

Electrochromic materials, in general, are those that exhibit a change in transmission, absorption, and/or color when a voltage is applied thereto. Exemplary electrochromic materials include oxides, such as those including/based on tungsten, niobium, molybdenum, iridium, titanium, vanadium, and nickel (and other d-block elements), polynuclear transition metal hexacyanometallates, and polymer electrochromics. Electrochromic materials, in either a testing or manufacturing environment, may be formed/deposited using, for example, physical vapor deposition (PVD) (e.g., sputtering), reactive sputtering, chemical vapor deposition (CVD), sol-gel processes (e.g., spray, dip, spin, etc.), wet coating and printing techniques, evaporation, electroplating, and spray pyrolysis.

Embodiments described herein provide methods and systems for combinatorial processing of electrochromic materials, electrolytes, transparent conductors, conductors, adhesion layers, nucleation layers, and diffusion barrier layers utilized in electrochromic devices and/or electrochromic devices as a whole. Combinatorial processing generally refers to techniques of differentially processing multiple regions of one or more substrates. In accordance with one aspect of the present invention, combinatorial processing may be used to produce and evaluate different materials, chemicals, processes, and techniques related to electrochromic materials, electrolytes, transparent conductors, conductors, adhesion layers, nucleation layers, and diffusion barrier layers, as well as build structures or determine how electrochromic materials and related materials in the device stack coat, fill or interact with existing structures. Combinatorial processing varies materials, unit processes and/or process sequences across multiple regions on a substrate, or multiple substrates.

In some embodiments, a plurality of regions (e.g., site-isolated regions) is designated on at least one substrate (e.g., a glass substrate). A first electrochromic material (or a first electrochromic device stack) is formed on a first of the plurality of regions on the at least one substrate with a first set of processing conditions. A second electrochromic material (or a second electrochromic device stack) is formed on a second of the plurality of regions on the at least one substrate with a second set of processing conditions. The second set of processing conditions is different than the first set of processing conditions. However, it should be understood, that in some embodiments, the use of the same set of processing conditions may be repeated on several of the regions (or one or more substrate) to test for consistency and repeatability.

The first electrochromic material and the second electrochromic material may then be characterized. One of the first set of processing conditions and the second set of processing conditions may be selected based on the characterizing of the first electrochromic material and the second electrochromic material.

As such, in accordance with some embodiments, combinatorial processing may be used to produce and evaluate different materials, substrates, chemicals, consumables, processes, process conditions, coating stacks, and techniques related to electrochromic materials, electrolytes, transparent conductors, conductors, adhesion layers, nucleation layers, and diffusion barrier layers, as well as build structures or determine how electrochromic materials, electrolytes, transparent conductors, conductors, adhesion layers, nucleation layers, and diffusion barrier layers coat, fill or interact with existing structures in order to vary materials, unit processes and/or process sequences across multiple site-isolated regions on the substrate(s). These variations may relate to specifications such as temperatures, temperature-time profiles, exposure times, number of deposition and cooling cycles, layer thicknesses, chemical compositions of majority and minority elements of layers, gas compositions, gas-pressure-time profiles, gas-composition-time profiles, chemical compositions of wet and dry surface chemistries, power, pressure, sputter mode (e.g., radio frequency (RF), direct current (DC), pulsed DC, ionized PVD) and related parameters, gas flow rates (e.g., argon, helium, xenon, nitrogen, oxygen, nitrous oxide, etc.), pump and valve conditions, and substrate-to-target distance of sputter deposition conditions, humidity, etc. of the formulations and/or the substrates at various stages of the screening processes described herein. However, it should be noted that in some embodiments, the chemical composition (e.g., of the electrochromic material and/or of the other components) remains the same, while other parameters are varied, and in other embodiments, the chemical composition is varied.

The manufacture of various devices, such as electrochromic devices, and related architectural glass, windows and fenestration, entails the integration and sequencing of many unit processing steps. For example, device manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as cost, (solar) bleaching performance, colouring performance, transmission modulation, transparency modulation, absorption modulation, reflection modulation, modulation (cycling) speed, modulation range, uniformity, number of repeatable colouring/bleaching cycles, the solar factor, the U-value ($W/m^2 K$), power consumption, energy saving performance, glare performance, UV blocking performance, durability, and reliability for the electrochromic device and its application.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as electrochromic devices. In particular, there is a need to be able to test i) more than one material, ii) more than one processing condition, iii) more than one sequence of processing conditions, iv) more than one process sequence integration flow, and combinations thereof, collectively known as "combinatorial process sequence integration," on a single monolithic substrate (e.g., an integrated or short-looped wafer) without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574, filed on Feb. 10, 2006, U.S. Pat. No. 7,824,935, filed on Jul. 2, 2008, U.S. Pat. No. 7,871,928, filed on May 4, 2009, U.S. Pat. No. 7,902,063, filed on Feb. 10, 2006, and U.S. Pat. No. 7,947,531, filed on Aug. 28, 2009, which are all herein incorporated by reference. Systems and methods for HPC processing are further described in U.S. patent application Ser. No. 11/352,077, filed on Feb. 10, 2006, claiming priority from Oct. 15, 2005, U.S. patent application Ser. No. 11/419,174, filed on May 18, 2006, claiming priority from Oct. 15, 2005, U.S. patent application Ser. No. 11/674,132, filed on Feb. 12, 2007, claiming priority from Oct. 15, 2005, and U.S. patent application Ser. No. 11/674,137, filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD).

FIG. 1 illustrates a schematic diagram 100 for implementing combinatorial processing and evaluation using primary, secondary, and tertiary screening. The schematic diagram 100 illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

Although not shown, an initial stage may be implemented which includes a fast screening/search of structure-material property relationships, known process-material relationships, known stack-product (device) relationships, etc. within any available literature prior to starting any experimentation that results in materials discovery. After this initial stage, for example, thousands of materials are evaluated during a materials discovery stage, 102. Materials discovery stage 102 is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage 104. Evaluation of the materials is performed using metrology tools such as ellipsometers, ultraviolet-visible (UV-VIS) spectrometers, reflectometers, interferometers, roughness and thickness measurement tools (e.g., scanning probe microscopes, stylus profilers, optical profilers, scanning interferometry, confocal laser scanning microscopy, optical microscopy, electron microscopy), X-ray fluorescence (XRF), electrochemical impedance spectrometers, hall measurements, optical transmission, reflection, and absorption testers, electronic testers and imaging tools (i.e., microscopes).

The materials and process development stage 104 may evaluate hundreds of materials (i.e., a magnitude smaller than the primary stage) and may focus on the processes used to deposit or develop those materials. Promising materials and processes are again selected, and advanced to the tertiary screen or process integration stage 106, where tens of materials and/or processes and combinations are evaluated. The tertiary screen or process integration stage 106 may focus on integrating the selected processes and materials with other processes and materials.

The most promising materials and processes from the tertiary screen are advanced to device qualification 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing 110.

The schematic diagram 100 is an example of various techniques that may be used to evaluate and select materials and processes for the development of new materials and processes. The descriptions of primary, secondary, etc. screening and the various stages 102-110 are arbitrary and the stages may overlap, occur out of sequence, be described and be performed in many other ways.

This application benefits from High Productivity Combinatorial (HPC) techniques described in U.S. patent application Ser. No. 11/674,137, filed on Feb. 12, 2007, which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of, for example, device manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate(s) that are equivalent to the structures formed during actual production of the device. For example, such structures may include, but would not be limited to, contact layers, buffer layers, transparent conductor layers, electrochromic layers, electrolyte layers, or any other series of layers or unit processes that create an intermediate structure found on devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate(s) during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate, or substrates, that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate(s) can be defined as needed, but are preferably systematized for ease of tooling and design of experimentation. In addition, the number, variants and location of structures within each region are designed to enable valid statistical analysis of the test results within each region and across regions to be performed.

Figure 2:
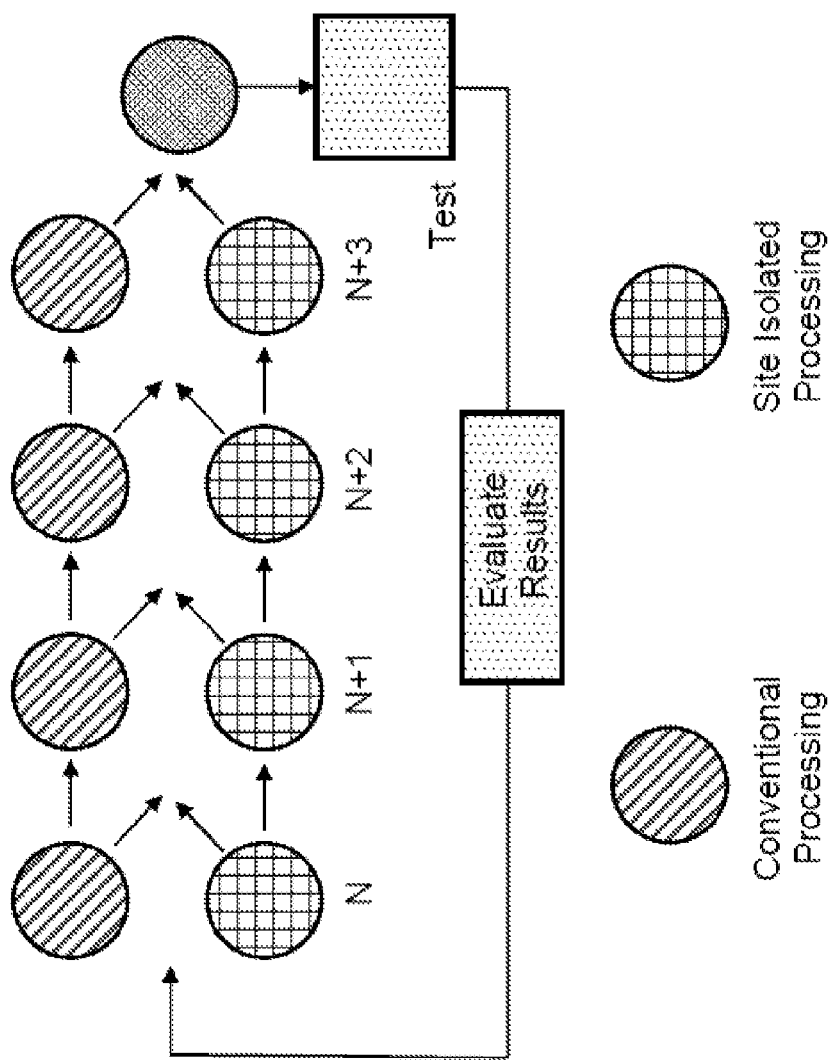
FIG. 2 is a simplified schematic diagram illustrating a general methodology for combinatorial process sequence integration that includes site isolated processing and/or conventional processing according to some embodiments.

FIG. 2 is a simplified schematic diagram illustrating a general methodology for combinatorial process sequence integration that includes site isolated processing and/or conventional processing in accordance with one embodiment of the invention. In one embodiment, the substrate(s) is initially processed using conventional process N. In one exemplary embodiment, the substrate is then processed using site isolated process N+1. During site isolated processing, an HPC module may be used, such as the HPC module described in U.S. patent application Ser. No. 11/352,077, filed on Feb. 10, 2006. The substrate(s) can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate, or from substrate to substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in device manufacturing may be varied.

Figure 3:
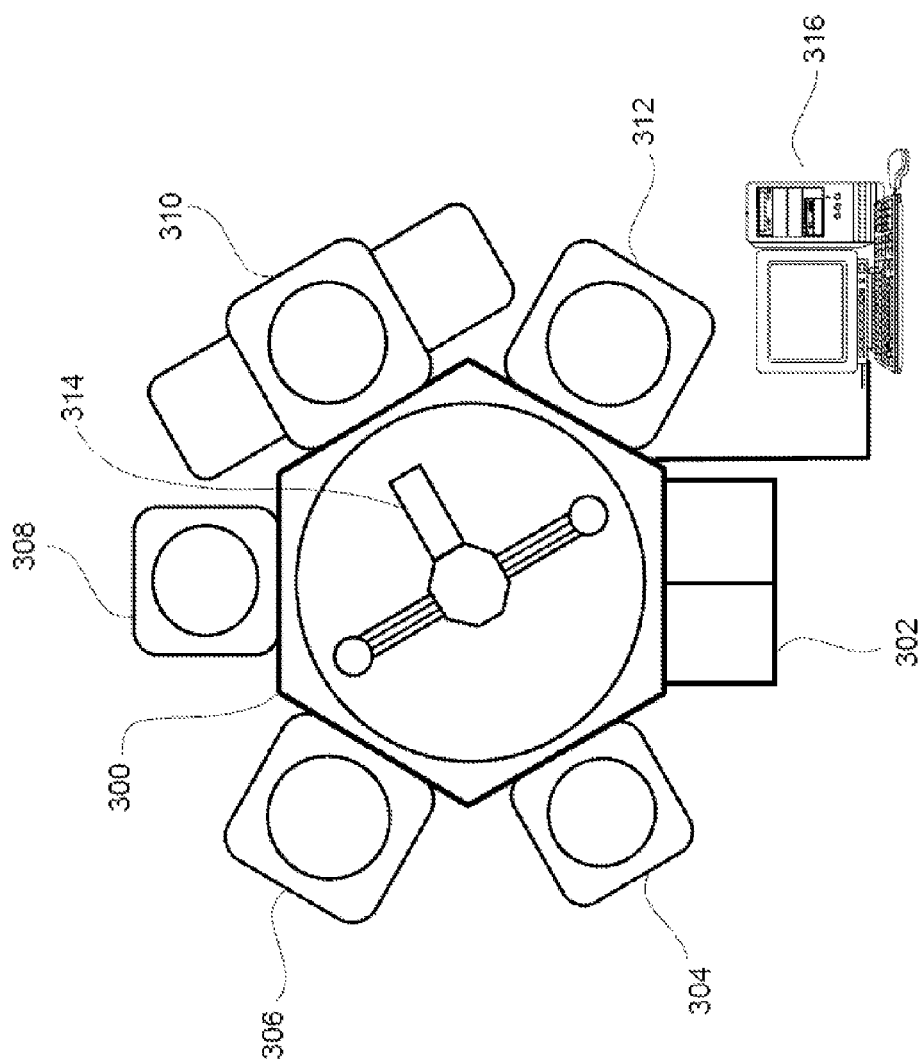
FIG. 3 is a simplified schematic diagram illustrating an integrated high productivity combinatorial (HPC) system according to some embodiments.

FIG. 3 is a simplified schematic diagram illustrating an integrated high productivity combinatorial (HPC) system according to some embodiments. HPC system includes a frame 300 supporting a plurality of processing modules. It should be appreciated that frame 300 may be a unitary frame in accordance with some embodiments. In some embodiments, the environment within frame 300 is a controlled atmosphere (or environment). As used herein, the phrase "controlled atmosphere" and "controlled environment" will be understood to be equivalent and will be understood to include one of a vacuum, or an inert gas. Examples of inert gases include helium, neon, argon, krypton, xenon, and nitrogen, as well as combinations thereof.

Still referring to FIG. 3, load lock/factory interface 302 provides access into the plurality of modules of the HPC system. Robot 314 provides for the movement of substrates (and masks) between the modules and for the movement into and out of the load lock 302.

Modules (or processing tools) 304-312 may be any set of modules and preferably include one or more combinatorial modules. For example, module 304 may be an orientation/degassing module, module 306 may be a clean module, either plasma or non-plasma based, modules 308 and/or 310 may be combinatorial/conventional dual purpose modules. Module 312 may provide conventional clean or degas as necessary for the experiment design.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device 316, may control the processes of the HPC system, including the power supplies and synchronization of the duty cycles described in more detail below. Further details of one possible HPC system are described in U.S. application No. 11/672,478 filed Feb. 7, 2007, now U.S. Pat. No. 7,867,904 and claiming priority to US Provisional Application No. 60/832,248 filed on Jul. 19, 2006, and U.S. application Ser. No. 11/672,473, filed Feb. 7, 2007, and claiming priority to U.S. Provisional Application No. 60/832,248 filed on Jul. 19, 2006, which are all herein incorporated by reference. With HPC system, a plurality of methods may be employed to deposit material upon a substrate employing combinatorial processes.

Figure 4:
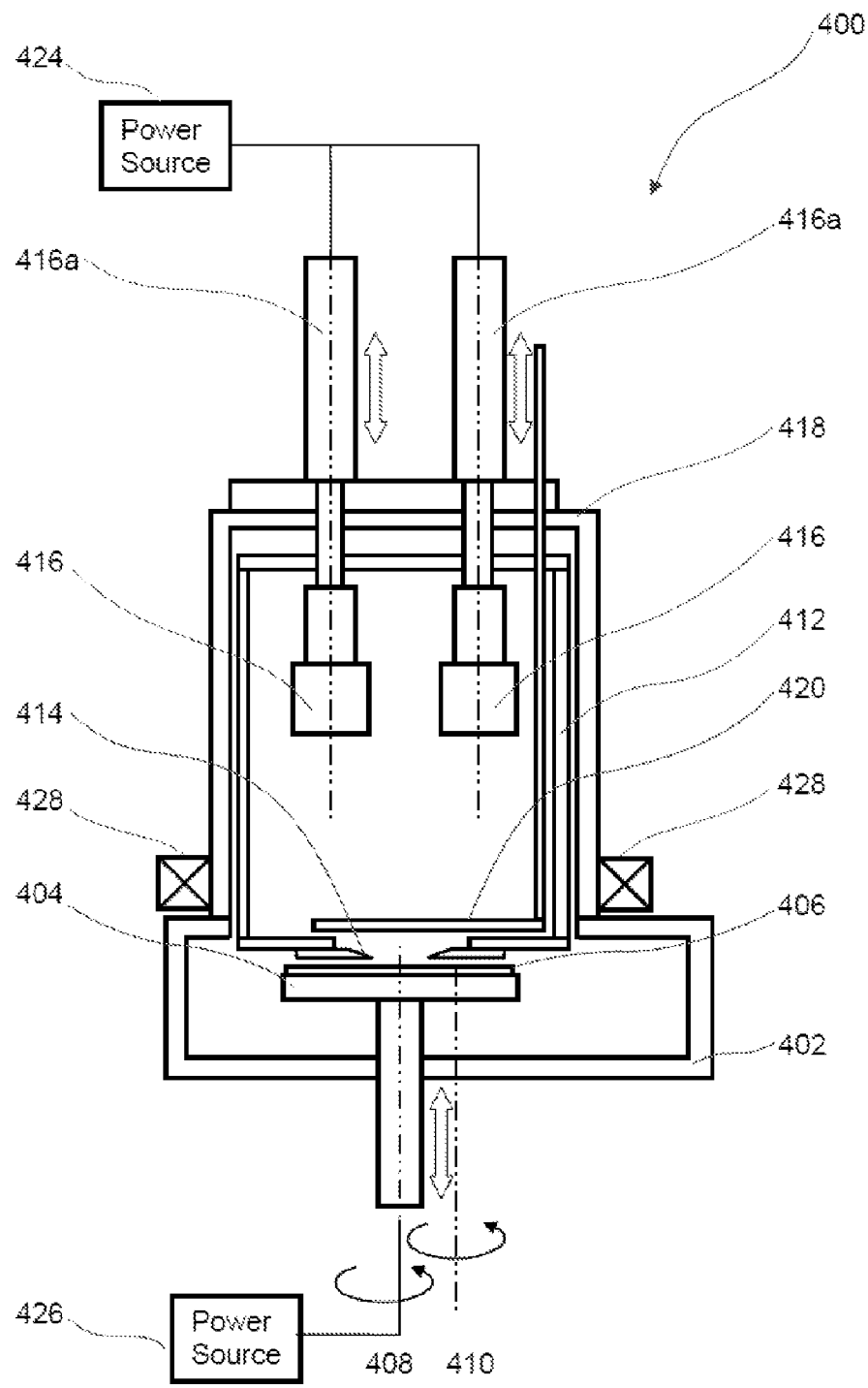
FIG. 4 is a simplified schematic diagram illustrating a sputter processing chamber configured to perform combinatorial processing and full substrate processing according to some embodiments.

FIG. 4 is a simplified schematic diagram illustrating a PVD processing module (or chamber or processing tool or system) 400, more particularly, a sputter chamber, configured to perform combinatorial processing and full substrate processing in accordance with some embodiments. The PVD processing module 400 may be one of the processing modules 304-312 in the system shown in FIG. 3.

Processing chamber 400 includes a bottom chamber portion 402 disposed under top chamber portion 418. Within bottom portion 402, substrate support 404 is configured to hold a substrate 406 disposed thereon and can be any known substrate support, including but not limited to a vacuum chuck, electrostatic chuck or other known mechanisms. Substrate support 404 is capable of both rotating around its own central axis 408 (referred to as "rotation" axis), and rotating around an exterior axis 410 (referred to as "revolution" axis). Such dual rotary substrate support is central to combinatorial processing using site-isolated mechanisms. Other substrate supports, such as an XY table, can also be used for site-isolated deposition. In addition, substrate support 404 may move in a vertical direction. It should be appreciated that the rotation and movement in the vertical direction may be achieved through known drive mechanisms which include magnetic drives, linear drives, worm screws, lead screws, a differentially pumped rotary feed through drive, etc. Power source 426 provides a bias power to substrate support 404 and substrate 406 and produces a negative bias voltage on substrate 406. In some embodiments, power source 426 provides a radio frequency (RF) power sufficient to take advantage of the high metal ionization to improve step coverage of vias and trenches of patterned wafers. In some embodiments, the RF power supplied by power source 426 is pulsed and synchronized with the pulsed power from power source 424.

Substrate 406 may be a conventional round 200 mm, 300 mm, or any other larger or smaller substrate/wafer size. In some embodiments, substrate 406 may be a square, rectangular, or other shaped substrate. In some embodiments, substrate 406 is made of glass, a polymer, a plastic, and/or polycarbonate. However, in other embodiments, the substrate 406 is made of a semiconductor material, such as silicon. One skilled in the art will appreciate that substrate 406 may be a blanket substrate, a coupon (e.g., partial wafer), or even a patterned substrate having predefined regions. In some embodiments, substrate 406 may have regions defined through the processing described herein. The term region is used herein to refer to a localized (or site-isolated) area on a substrate which is, was, or is intended to be used for processing or formation of a selected material. The region can include one region and/or a series of regular or periodic regions predefined on the substrate. The region may have any convenient shape, e.g., circular, rectangular, elliptical, wedge-shaped, etc. In the semiconductor field, a region may be, for example, a test structure, single die, multiple dies, portion of a die, other defined portion of substrate, or an undefined area of a substrate, e.g., blanket substrate which is defined through the processing.

Top chamber portion 418 of chamber 400 in FIG. 4 includes process kit shield 412, which defines a confinement region over a radial portion of substrate 406. Process kit shield 412 is a sleeve having a base (optionally integrated with the shield) and an optional top within chamber 400 that may be used to confine a plasma generated therein. The generated plasma will dislodge atoms from a target and the sputtered atoms will deposit on an exposed surface of substrate 406 to combinatorial process regions of the substrate in a site-isolated manner (e.g., such that only the particular region on the substrate is processed) in some embodiments. In other embodiments, full wafer processing can be achieved by optimizing gun tilt angle and target-to-substrate spacing, and by using multiple process guns 416. Process kit shield 412 is capable of being moved in and out of chamber 400 (i.e., the process kit shield is a replaceable insert). In other embodiments, process kit shield 412 remains in the chamber for both the full substrate and combinatorial processing. Process kit shield 412 includes an optional top portion, sidewalls and a base. In some embodiments, process kit shield 412 is configured in a cylindrical shape, however, the process kit shield may be any suitable shape and is not limited to a cylindrical shape.

The base of process kit shield 412 includes an aperture 414 through which a surface of substrate 406 is exposed for deposition or some other suitable semiconductor processing operations. Aperture shutter 420 which is moveably disposed over the base of process kit shield 412. Aperture shutter 420 may slide across a bottom surface of the base of process kit shield 412 in order to cover or expose aperture, 414, in some embodiments. In other embodiments, aperture shutter 420 is controlled through an arm extension which moves the aperture shutter to expose or cover aperture 414. It should be noted that although a single aperture is illustrated, multiple apertures may be included. Each aperture may be associated with a dedicated aperture shutter or an aperture shutter can be configured to cover more than one aperture simultaneously or separately. Alternatively, aperture 414 may be a larger opening and aperture shutter 420 may extend with that opening to either completely cover the aperture or place one or more fixed apertures within that opening for processing the defined regions. The dual rotary substrate support 404 is central to the site-isolated mechanism, and allows any location of the substrate or wafer to be placed under the aperture 414. Hence, the site-isolated deposition is possible at any location on the wafer/substrate.

In the example shown in FIG. 4, two process guns 416 are included. Process guns 416 are moveable in a vertical direction so that one or both of the guns may be lifted from the slots of the shield. While two process guns are illustrated, any number of process guns may be included (e.g., one, three, four or more process guns). Where more than one process gun is included, the plurality of process guns may be referred to as a cluster of process guns. In some embodiments, process guns 416 are oriented or angled so that a normal reference line extending from a planar surface of the target of the process gun is directed toward an outer periphery of the substrate in order to achieve good uniformity for full substrate deposition film. The target/gun tilt angle depends on the target size, target-to-substrate spacing, target material, process power/pressure, etc.

Top chamber portion 418 of chamber 400 of FIG. 4 includes sidewalls and a top plate which house process kit shield 412. Arm extensions 416a which are fixed to process guns 416 may be attached to a suitable drive, (i.e., lead screw, worm gear, etc.), configured to vertically move process guns 416 toward or away from a top plate of top chamber portion 418. Arm extensions 416a may be pivotally affixed to process guns 416 to enable the process guns to tilt relative to a vertical axis. In some embodiments, process guns 416 tilt toward aperture 414 when performing combinatorial processing and tilt toward a periphery of the substrate being processed when performing full substrate processing. It should be appreciated that process guns 416 may tilt away from aperture 414 when performing combinatorial processing in other embodiments. In yet other embodiments, arm extensions 416a are attached to a bellows that allows for the vertical movement and tilting of process guns 416. Arm extensions 416a enable movement with four degrees of freedom in some embodiments. Where process kit shield 412 is utilized, the aperture openings are configured to accommodate the tilting of the process guns. The amount of tilting of the process guns may be dependent on the process being performed in some embodiments.

Power source 424 provides power for sputter guns 416 whereas power source 426 provides RF bias power to an electrostatic chuck. As mentioned above, the output of power source 426 is synchronized with the output of power source 424. It should be appreciated that power source 424 may output a direct current (DC) power supply or a radio frequency (RF) power supply. In other embodiments, the DC power is pulsed and the duty cycle is less than 30% on-time at maximum power in order to achieve a peak power of 10-15 kilowatts. Thus, the peak power for high metal ionization and high density plasma is achieved at a relatively low average power which will not cause any target overheating/cracking issues. It should be appreciated that the duty cycle and peak power levels are exemplary and not meant to be limiting as other ranges are possible and may be dependent on the material and/or process being performed.

Figure 5:
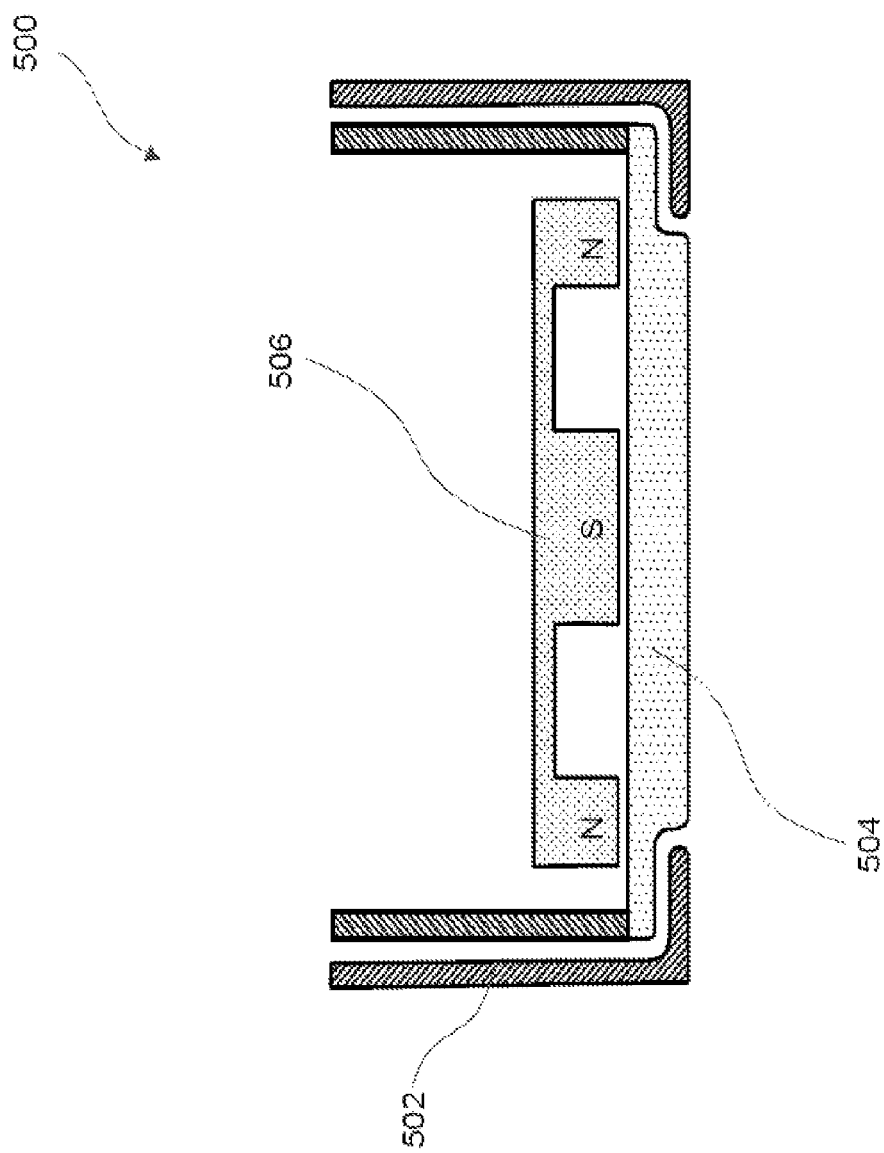
FIG. 5 is a simplified schematic diagram illustrating a sputter processing gun configured to perform combinatorial processing and full substrate processing according to some embodiments.

FIG. 5 is a simplified schematic diagram illustrating a sputter processing chamber configured to perform combinatorial processing and full substrate processing before implementation of some embodiments of the present invention. FIG. 5 illustrates a portion of a sputter gun 500 that would be part of the sputter gun 416 in FIG. 4. Illustrated in FIG. 5 is a grounded shield 502 surrounding the exterior of the target 504 and a magnetron 506 assembly.

Using processing chamber 400, perhaps in combination with other processing tools, electrochromic materials and related materials in the stack of electrochromic devices may be developed and evaluated in the manner described above. In particular, in some embodiments, electrochromic materials may be formed on different site-isolated regions of substrate 406 (or on multiple substrates) under varying processing conditions (including the formation/deposition of different electrochromic material). For example, electrochromic material may be ejected from one of more of targets 504 and deposited onto a first of the regions on substrate 406 under a first set of processing conditions, and either sequentially or simultaneously, electrochromic material may be ejected from one of more of targets 504 and deposited onto a second of the regions on substrate 406 under a different, second set of processing conditions. The electrochromic material(s) (and/or electrochromic material processing conditions) may then be characterized. Particular materials and/or processing conditions may then be selected (e.g., for further testing or use in devices) based on the desired parameters.

Figure 9:
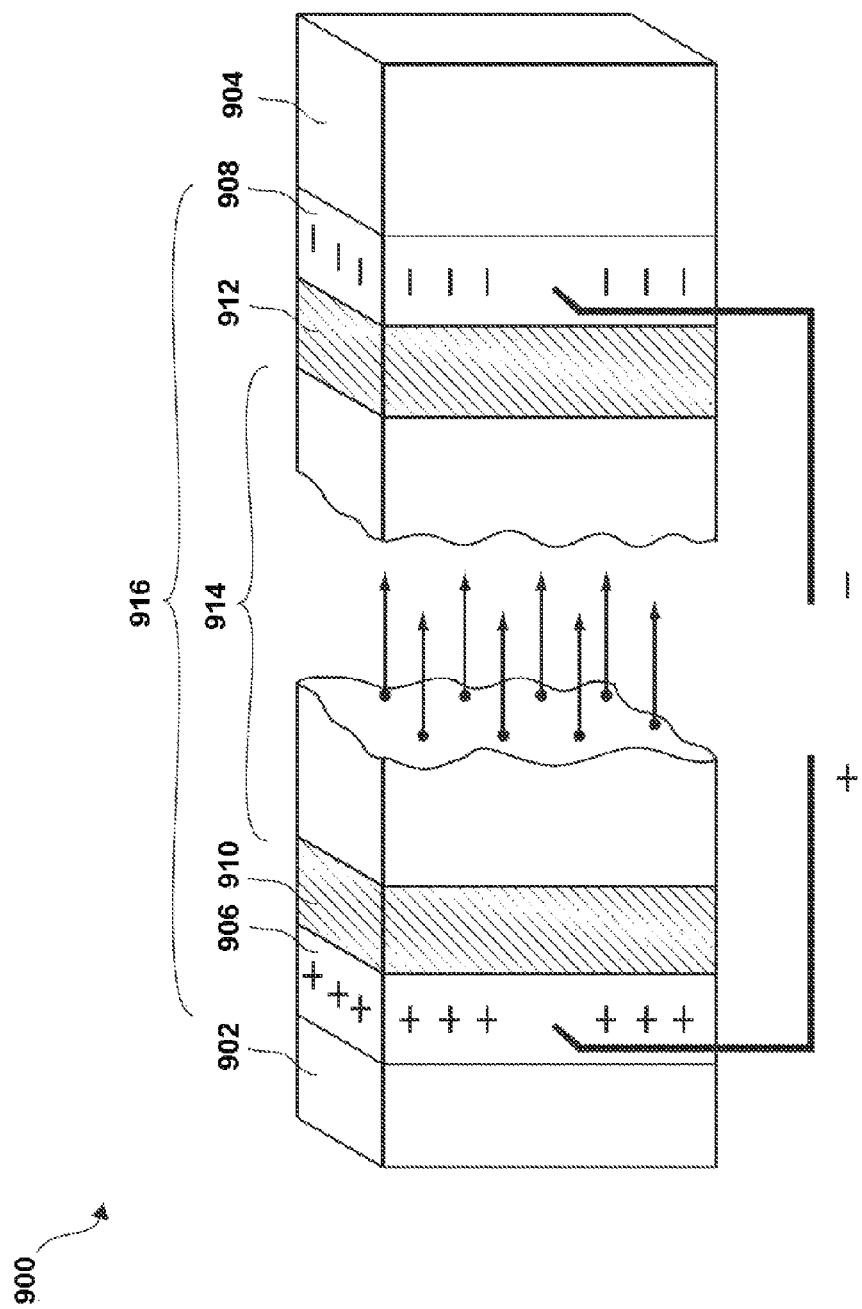
FIG. 9 is a simplified schematic diagram illustrating an electrochromic device according to some embodiments.

It should be understood that the development of the electrochromic materials and related materials in the stack of the electrochromic device (and/or electrochromic devices) may involve the use of multiple processing tools, such as modules 304-312 in FIG. 3. For example, various other materials/layers (e.g., as shown in FIG. 9), in addition to the electrochromic material, may be formed on each site-isolated region on the substrate, and additional processing steps, such as cleanings, may be performed at various stages of the processing, in processing tools/chambers different from the one in which the electrochromic material(s) is formed. This processing may utilize several of the modules 304-312 and involve transporting the substrate between the modules in a controlled environment (e.g., without breaking vacuum).

Figure 6:
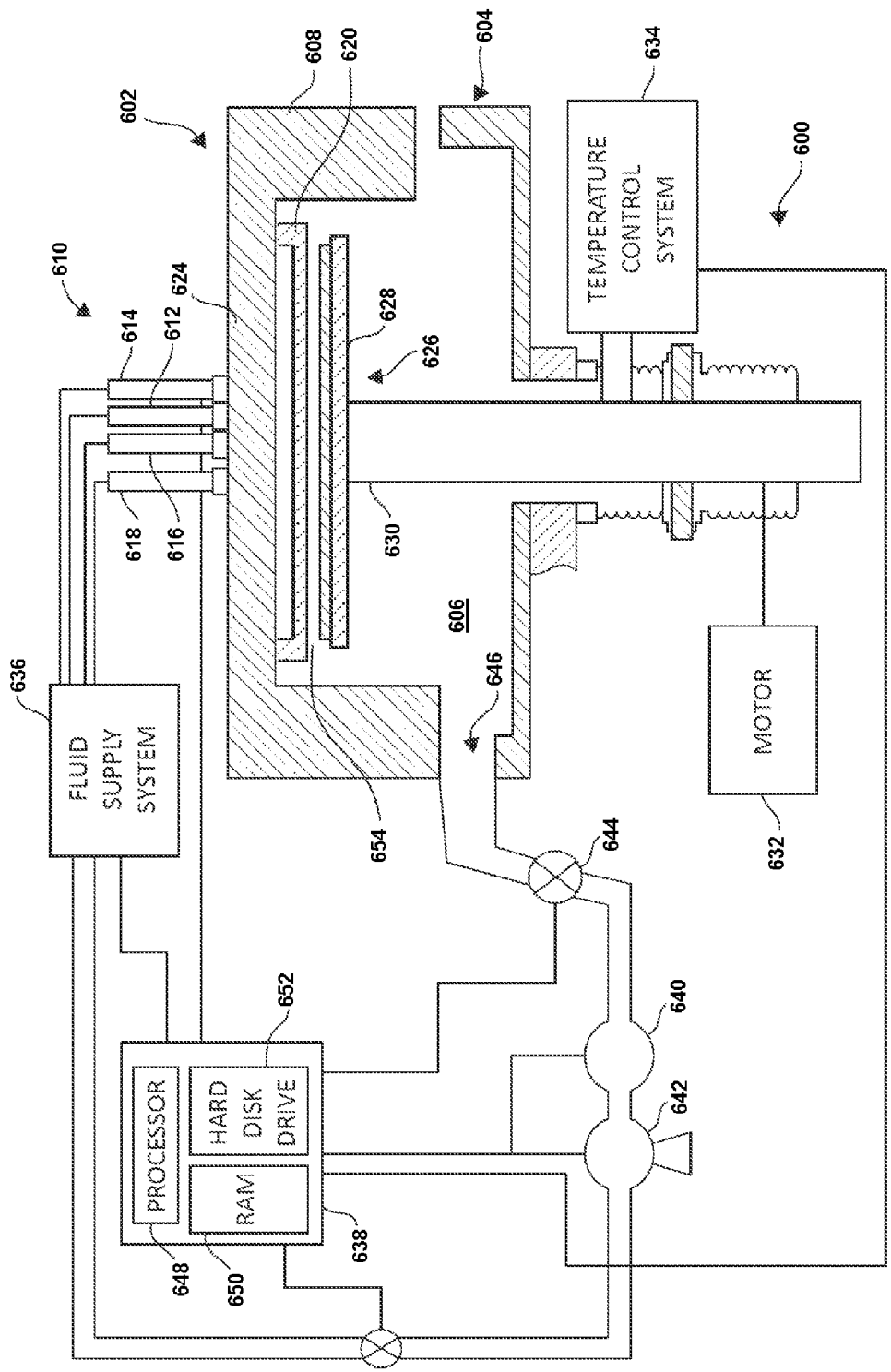
FIG. 6 is a cross-sectional schematic view of a vapor deposition processing module according to some embodiments.

FIG. 6 illustrates an ALD (or CVD) processing module (or system or tool) 600 according to some embodiments. The processing module 600 may be one of the processing modules 304-312 in the system shown in FIG. 3.

The module 600 includes an enclosure assembly 602 formed from a process-compatible material, such as aluminum or anodized aluminum. The enclosure assembly 602 includes a housing 604, which defines a processing chamber 606, and a vacuum lid assembly 608 covering an opening to the processing chamber 606 at an upper end thereof. Although only shown in cross-section, it should be understood that the processing chamber 606 is enclosed on all sides by the housing 604 and/or the vacuum lid assembly 608.

A fluid conduit assembly 610 is mounted to the vacuum lid assembly 608 and includes a plurality of fluid conduit branches (or injection ports) 612, 614, 616, and 618 and a showerhead 620 to deliver processing fluids (e.g., precursors, reactants, and carrier fluids) into the processing chamber 606. The showerhead 620 may be moveably coupled to an upper portion of the vacuum lid assembly 608 (i.e., a backing plate 624). The showerhead 620 may be formed from any known material suitable for the application, including stainless steel, aluminum, anodized aluminum, nickel, ceramics and the like. In some embodiments, the showerhead 620 may be considered a component separate from the fluid conduit assembly.

Referring again to FIG. 6, the module 600 also includes a heater/lift assembly 626 disposed within processing chamber 606. The heater/lift assembly 626 includes a support pedestal (or substrate support) 628 connected to an upper portion of a support shaft 630. The support pedestal 628 is positioned between shaft 630 and the backing plate 624 and may be formed from any process-compatible material, including aluminum nitride and aluminum oxide. The support pedestal 628 is configured to hold or support a substrate and may be a vacuum chuck, as is commonly understood, or utilize other conventional techniques, such as an electrostatic chuck (ESC) or physical clamping mechanisms, to prevent the substrate from moving on the support pedestal 628. The support shaft 630 is moveably coupled to the housing 604 so as to vary the distance between support pedestal 628 and the backing plate 624. That is, the support shaft 630 may be vertically moved to vary the distance between the support pedestal 628 and the backing plate 624. In the depicted embodiment, a lower portion of the support shaft 630 is coupled to a motor 632 which is configured to perform this movement. Although not shown, a sensor may provide information concerning the position of the support pedestal 628 within processing chamber 606.

The support pedestal 628 may be used to heat the substrate through the use of heating elements (not shown) such as resistive heating elements embedded in the pedestal assembly. In the embodiment shown in FIG. 6, a temperature control system 634 is provided to control the heating elements, as well as maintain the chamber housing 604, vacuum lid assembly 608, and showerhead 620 within desired temperature ranges in a conventional manner.

Still referring to FIG. 6, the module 600 also includes a fluid supply system 636 and a controller (or system control system) 638. The fluid supply system 636 is in fluid communication with the fluid conduit branches 612, 614, 616, and 618 through a sequence of fluid conduits (or fluid lines).

The fluid supply system 636 (and/or the controller 638) controls the flow of processing fluids to, from, and within the processing chamber 606 with a pressure control system that includes, in the embodiment shown, a turbo pump 640 and a roughing pump 642. The turbo pump 640 and the roughing pump 642 are in fluid communication with processing chamber 606 via a butterfly valve 644 and a pump channel 646. Although not shown, the fluid supply system 636 may include a plurality of processing fluid supplies (or sources) which include various processing fluids, such as reagents (e.g., precursors (or sources) and/or reactants (or oxidants)) for performing ALD (or CVD) processing, as is commonly understood. In some embodiments, the fluid supply system 636 (and/or the module 600 as a whole) also includes one or more vacuum lines (e.g., coupled to a "house vacuum," as is commonly understood). Further, the fluid supply system 636 (and/or the fluid conduit assembly 610) may includes various components for controlling the flow of processing fluids, such as valves, mass flow controllers (MFCs), etc.

The controller 638 includes a processor 648 and memory, such as random access memory (RAM) 650 and a hard disk drive 652. The controller 638 is in operable communication with the various other components of the processing module 600, including the turbo pump 640, the temperature control system 634, the fluid supply system 636, and the motor 632 and controls the operation of the entire processing module to perform the methods and processes described herein.

During operation, the module 600 establishes conditions in a processing region 654 between an upper surface of the substrate and the showerhead 620, such as injecting precursors (or reagents), as well as purge gases, to form the desired material on the surface of the substrate. In particular, in some embodiments, the fluid supply system 636 provides various processing fluids (e.g., precursors, reactants, etc.) to the showerhead 620, from which the fluids flow onto the substrate to, for example, form a layer of material on the substrate (e.g., via ALD).

Figure 7:
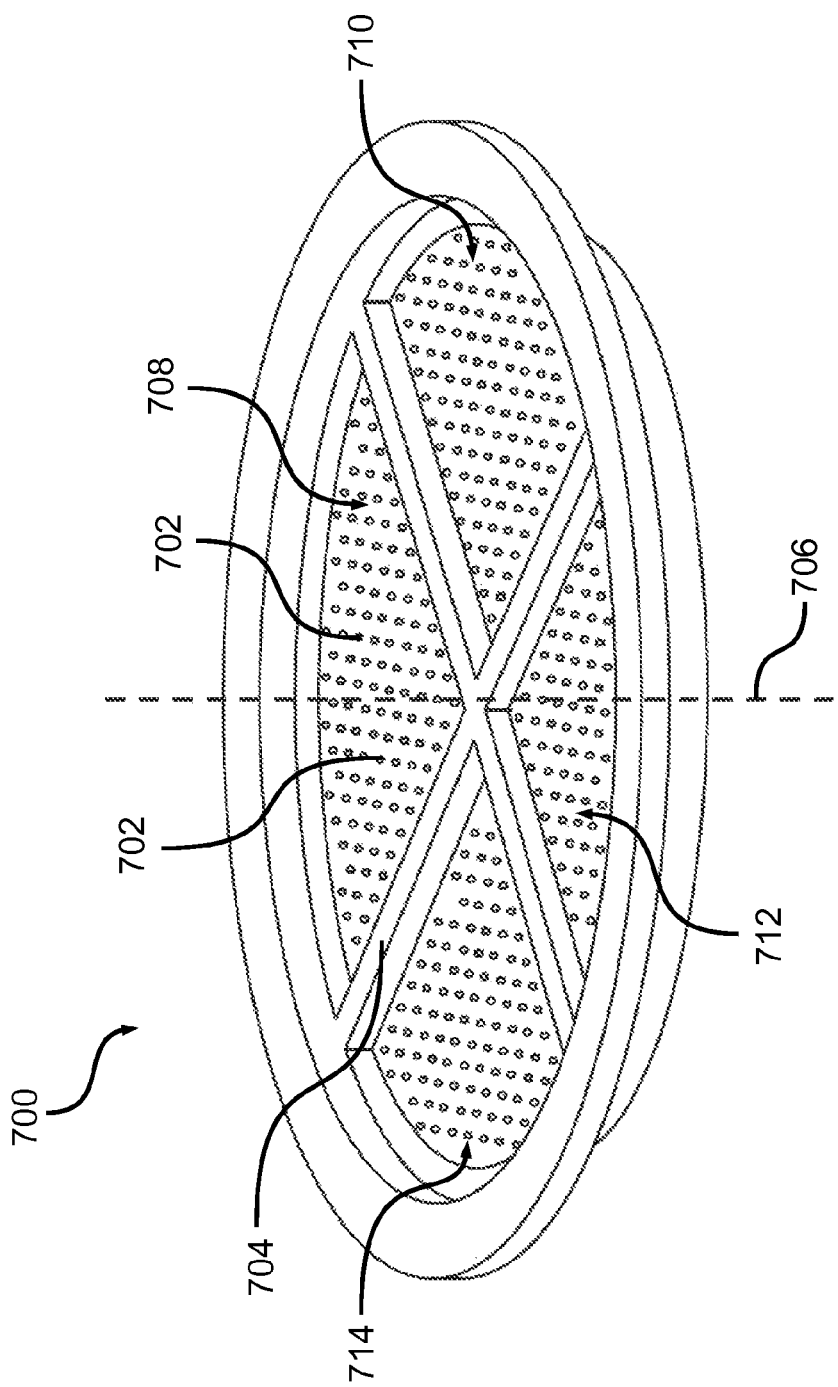
FIG. 7 is an isometric view of a showerhead within the vapor deposition processing module of FIG. 6.

FIG. 7 illustrates a showerhead 700 (e.g., showerhead 620 in FIG. 6) according to some embodiments. In some embodiments, the showerhead 700 is substantially circular and has a diameter of, for example, between about 200 millimeters (mm) and about 500 mm. The showerhead 700 includes a plurality of injection ports (or openings) 702 extending therethrough and a fluid separation mechanism 704 that, in the depicted embodiments, extends upwards from a central portion of a main body of the showerhead 700. Although not shown in detail, each of the injection ports 702 may have a diameter that varies as it extend through the showerhead 700, with a larger diameter near the upper surface of the showerhead 700 (i.e., near the fluid separation mechanism 704). The showerhead 700 may be made of from any known material suitable for the application, including stainless steel, aluminum, anodized aluminum, nickel, ceramics and the like.

In the depicted embodiment, the fluid separation mechanism 704 includes several substantially linear portions of material that meet at a central axis 706 of the showerhead 700 and divide the showerhead 700 (and/or the injection ports 702) into four regions (or portions) or quadrants 708, 710, 712, and 714, each of which may be aligned with a respective one of the fluid conduit branches 612, 614, 616, and 618 (FIG. 6). The distance that fluid separation mechanism 704 extends from the main body of the showerhead 700 is dependent upon the specific design parameters and may vary in different embodiments. However, in at least some embodiments, the fluid separation mechanism 704 provides sufficient separation to minimize, if not prevent, fluids from diffusing between the different portion 708-714 of the showerhead 700.

It should be understood that each of the portions 708-714 of the showerhead 700 may correspond to a site-isolated region defined on the substrate being processed. That is, processing fluids delivered to each of the portions 708-714 may flow through the respective injection ports 702 (i.e., the injection ports 702 within that portion) to process a region on the substrate (e.g., having about the same size and shape as the respective portion of the showerhead 700) in a site-isolated manner. As such, the portions 708-714 of the showerhead 700 shown in FIG. 7 may also be considered to represent the site-isolated regions on the substrate. Thus, the showerhead 700 (and/or the module 600 in FIG. 6 as a whole) is capable of processing different regions on the substrate in a site-isolated (and perhaps combinatorial) manner.

In some embodiments, the fluid separation mechanism 704 may include (or be made of) a series of channels extending across the main body of the showerhead 700, or additional injection ports 702, through which a processing fluid (e.g., an inert gas, such as argon) may be flowed to "block" the other processing fluids from flowing between the quadrants 708-714. It should be understood that in some embodiments the fluid separation mechanism 704 divides the showerhead 700 into a different number (and size/shape) of portions (e.g., two, three, or more than four portions), thereby also defining a different number (and/or size/shape) of site-isolated regions on the substrate.

Figure 8:
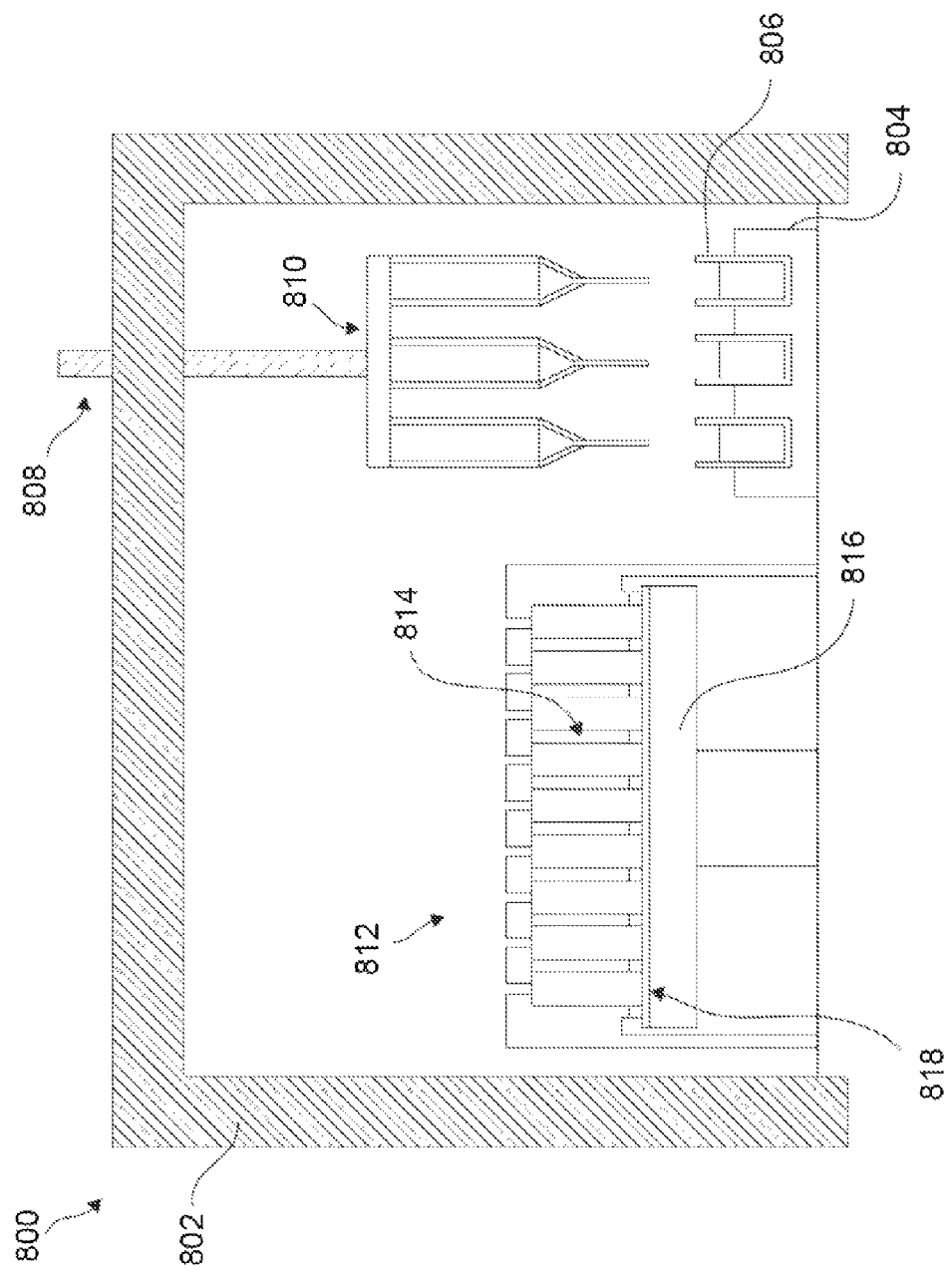
FIG. 8 is a simplified schematic diagram illustrating a wet processing tool configured to perform combinatorial processing according to some embodiments.

FIG. 8 is a simplified view of a combinatorial wet processing tool 800, according to some embodiments. Similarly to the chambers shown in FIGS. 4 and 6, wet processing tool 800 may be used to perform combinatorial processing on multiple site-isolated regions on a substrate using, in this case, wet processing techniques.

The combinatorial wet processing tool 800 includes a housing (and/or processing chamber) 802, a well holder 804 holding wells 806, and a dispense arm 808 having a dispense head 810. The wet processing tool 800 also includes a reactor assembly 812 having an array of reactors (or fluid containers) 814 positioned over a substrate support 816. A substrate 818 is placed on the substrate support 816 and positioned relative to the reactors 814 such that bottom edges of the reactors contact the substrate 818 and form seals around respective, site-isolated regions of the substrate 818. The dispense arm 810 may retrieve (e.g., via syringes) formulations (e.g., sol-gel formulations including electrochromic materials) from the wells 806 and dispense them into the reactors 814. Because of the seals formed between the reactors 814 and the substrate 818, the formulations remain within the reactors 814 and on the respective site-isolated regions of the substrate 818, and are thus isolated from the other formulations and regions on the substrate 818. The formulations may be varied by varying, for example, the chemical composition or exposure time.

FIG. 9 schematically illustrates an electrochromic device 900 according to some embodiments. The electrochromic device 900 includes a first transparent substrate 902, a second transparent substrate 904, a first transparent conductor 906, a second transparent conductor 908, an ion storage film 910, an electrochromic layer 912, and an ion conductor 914. It should be understood that the electrochromic device 900 is merely intended to provide an example of a device in which electrochromic material(s) may be used and that, in other embodiments, the electrochromic material(s) may be used in devices with different types, arrangements, and numbers of layers/components.

It should be understood that depending the application of the electrochromic device 900, one of the conductors may be opaque. Also, one of the transparent substrates may be replaced by a transparent diffusion barrier layer (e.g., barrier to moisture and oxygen), and/or a scratch-resistance layer, and/or an anti-microbial layer, and/or an anti-glare or anti-reflection layer, and/or a low-emissivity coating (stack), and/or a self-cleaning layer. One or more of the substrates may be coated by a transparent diffusion barrier layer (e.g., barrier to moisture and oxygen), and/or a scratch-resistance layer, and/or an anti-microbial layer, and/or an anti-glare or anti-reflection layer, and/or a low-emissivity coating (stack), and/or a self-cleaning layer.

As shown, the components of the electrochromic device 900 are arranged such that the first and second transparent substrates 902 and 904 are positioned on opposing sides of an electrochromic stack 916 that includes the ion conductor 914 at a central portion thereof. The ion storage film 910 and the electrochromic layer 912 are adjacent to and on opposing sides of the ion conductor 914. The first transparent conductor 906 is between the first transparent substrate 902 and the ion storage film 910, and the second transparent conductor 908 is between the second transparent substrate 904 and the electrochromic layer 912.

In some embodiments, the entire electrochromic stack 916 is formed on one of the transparent substrates 902 and 904 and the other transparent substrate is attached using, for example, a lamination process. It should be noted though that some embodiments may use only one transparent substrate. However, in other embodiments, some of the components of the electrochromic stack 916 are formed on the first transparent substrate 902, while others are formed on the second transparent substrate 904. The two substrates are then attached using, for example, a lamination process such that the components of the electrochromic stack 916 are "sandwiched" between the first and second transparent substrates 902 and 904 as shown in FIG. 9.

The deposition of the various layers on either of the transparent substrates 902 and 904 may be performed using, for example, PVD, reactive (or plasma enhanced) sputtering, CVD, and/or ALD. In some embodiments, the electrochromic stack 916 fills the entire space between the first and second transparent substrates 902 and 904. However, in other embodiments, the electrochromic stack 916 may only be formed within isolated portions of the space between the first and second transparent substrates 902 and 904.

Still referring to FIG. 9, the first and second transparent substrates 902 and 904 may be made of, for example, glass (e.g., standard float glass, or borosilicate glass), flexible polymer foil (i.e., the substrates 902 and 904 may be rigid or flexible), plastic, or polycarbonate and have a thickness of, for example, between 25 micrometers and 4 millimeters (mm). In a testing environment, the transparent substrates 902 and 904 may be round with a diameter of, for example, 200 or 300 mm. However, in a manufacturing environment, the substrates 902 and 904 may be square or rectangular and significantly larger (e.g., 0.5-3.0 meters (m) across), or the substrate maybe a coil or roll of foil.

In some embodiments, the first and second transparent conductors 906 and 908 are layers of indium-tin oxide (ITO) and/or indium-zinc oxide. Other examples of materials that could be used include fluorine-doped tin oxide, aluminum-doped zinc oxide, gallium-doped zinc oxide, poly(3,4-ethylene-dioxythiophene) (PEDOT), carbon nanotubes, and calcium aluminate (or mayenite). The first and second transparent conductors 906 and 908 may have a thickness of, for example, between about 10 nanometers (nm) and about 500 nm.

The ion storage film (or first layer of electrochromic material) 910 is, in one embodiment, made of nickel oxide and has a thickness of, for example, between about 10 nm and about 30 nm. The electrochromic layer (or second layer of electrochromic material) 912 is, in some embodiments, made of tungsten oxide and has a thickness of, for example, between about 10 nm and about 30 nm. However, it should be understood that other electrochromic materials may be used for the ion storage film 910 and the electrochromic layer 912, which are similarly capable of conducting ions and electrons. For example, other electrochromic materials may be (e.g., oxides) based on molybdenum, iridium, titanium, vanadium, nickel, and niobium (and other d-block metals), as well as polynuclear transition metal hexacyanometallates, and polymer electrochromics. The electrochromic materials may be formed/deposited using, for example, PVD, reactive sputtering, CVD, sol-gel processes (e.g., spray, dip, spin, etc.), evaporation, electroplating, and spray pyrolysis.

In some embodiments, the ion conductor 914 is an electrolyte, which may be a porous polymer separator with wet electrolyte inside the pores (e.g., separators made by Celgard, LLC of Charlotte, N.C., and separators used in the wet battery industry) or inorganic (e.g., based on an oxide film, such as tantalum oxide). The ion conductor 914 may have a thickness of, for example, between about 30 nm and about 80 nm. The ions within the ion conductor 914 are preferably small in order to promote mobility. Suitable examples of ions include hydrogen (H+), lithium (Li+), and magnesium ($Mg_2$+).

In some embodiments, the ion conductor 914 is an electrical insulator, while still being ionically conductive. As will be appreciated by one skilled in the art, in type-I and type-II electrochromic devices, the electrochromic material is dissolved in a liquid electrolyte, which may be either aqueous or a polar organic solvent such as acetonitrile or a variety of other nitriles, dimethylformamide, propylene carbonate or g-butyrolactone. In type-III systems, the electrolyte holds no soluble electrochromic material. Additional examples of electrolytes include those based on inorganic electrolytes, such as lithium aluminum fluoride, lithium niobate, antimony pentoxide, tantalum oxide, titanium oxide, hydrogen uranyl phosphate (HUP), and zirconium oxide, and organic electrolytes, such as polyelectrolytes (e.g., poly(2-acrylamido-2-methylpropanesulfonic acid) and poly(AMPS) and polymer electrolytes (e.g., poly(ethylene oxide) (PEO) and poly(vinyl chloride) (PVC).

It should be understood that each of the individual components/layers of the electrochromic device 900, particularly the electrochromic layer 912, the ion storage film 910, and/or the ion conductor 914, and/or the electrochromic device 900 as a whole (or the electrochromic stack 916), may be investigated and/or evaluated using the combinatorial processing techniques described above to, for example, optimize the performance of the electrochromic device 900.

As schematically indicated in FIG. 9, when a voltage is applied across the first and second transparent conductors 906 and 908, ions within the ion conductor 914 are shuttled between the ion storage film 910 and the electrochromic layer 912. The transportation of the ions causes the optical properties (e.g., optical transmission, absorption, or reflection) of the device 900 to be altered, as is commonly understood. A reversal of the voltage, or short-circuiting between the transparent conductors 906 and 908, may be applied to return the device 900 to the original state (i.e., optical transmission, absorption, etc.).

Although not shown, it should also be understood that the electrochromic device 900 may be a portion of (or installed in) a larger, more complex device or system, such as a window for energy efficiency or transparency cycling. Such a window may include multiple glass substrates (or panes), other coatings (or layers), such low-e (i.e., infra-red blocking) and thermochromic coatings formed on different panes than the electrochromic stack 916, and various barrier or spacer layers formed between adjacent panes.

Figure 10:
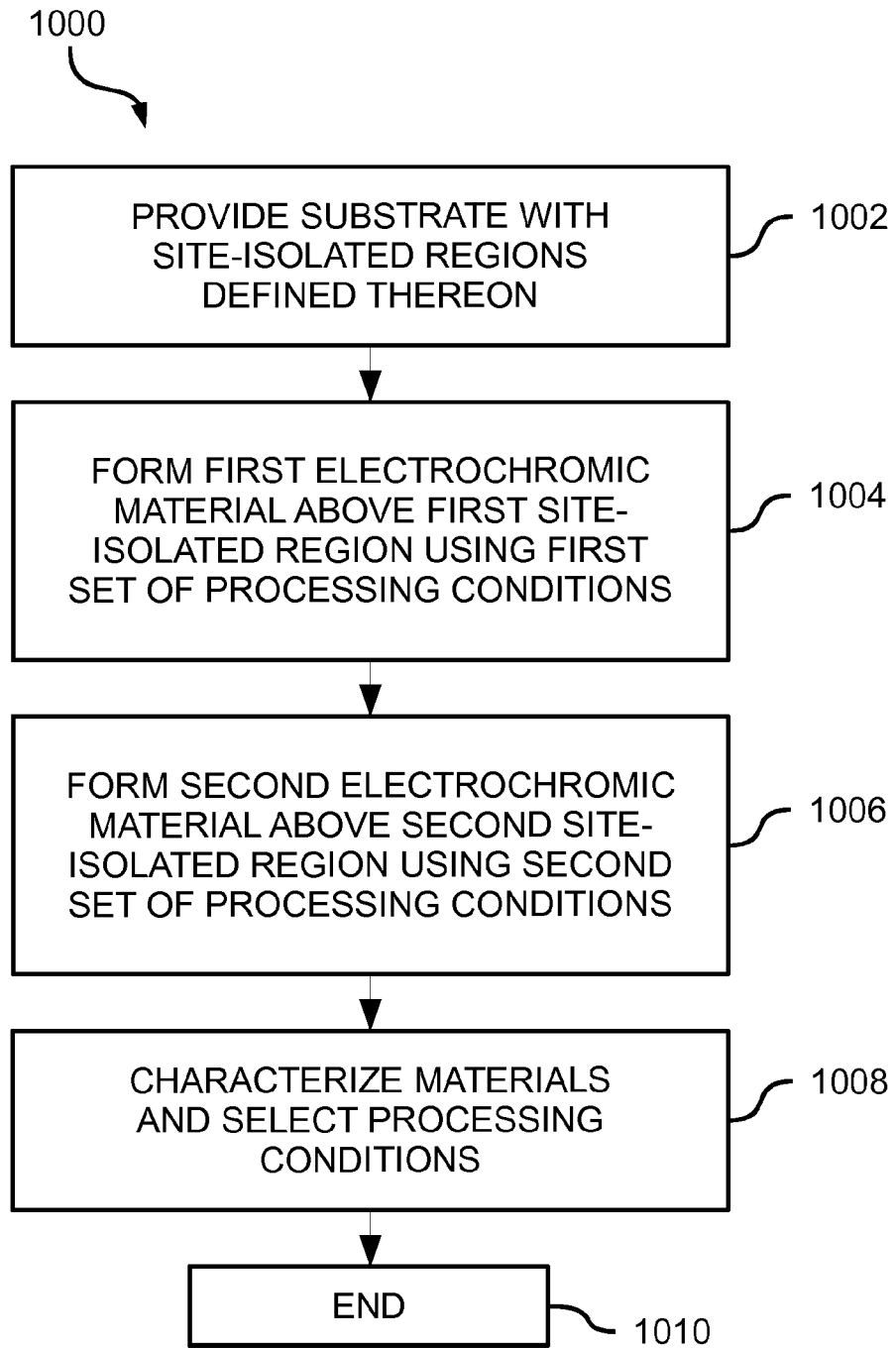
FIG. 10 is a flow chart illustrating a method for evaluating electrochromic processing conditions according to some embodiments.

FIG. 10 is a flow chart illustrating a method 1000 for evaluating electrochromic material processing conditions (and/or electrochromic materials) according to some embodiments. At block 1002, the method 800 begins with a substrate (or at least one substrate) being provided. The substrate(s) has a plurality of site-isolated regions defined thereon.

At block 1004, a first electrochromic material (or a first electrochromic device stack) is formed on a first of the site-isolated regions using a first set of processing conditions. At block 1006, a second electrochromic material is formed on a second of the site-isolated regions using a second set of processing conditions (i.e., different from the first set of processing conditions). Thus, the electrochromic material(s) (or other material(s) used in electrochromic device stacks) is deposited in a combinatorial manner across the site-isolated regions on the substrate(s), in a manner similar to that described above.

In the embodiment depicted in FIG. 10, at block 1008, the first and second electrochromic materials are then characterized, and suitable processing conditions are selected based on the characterization of the electrochromic material(s), as described in greater detail above. At block 1010, the method 1000 ends.

It should be understood that the method 1000 may similarly be applied to other components in electrochromic devices, such as the those described above and shown in FIG. 9 (e.g., the ion conductor 914).

Thus, in some embodiments, methods for evaluating electrochromic material processing conditions are provided. A substrate is provided. The substrate has a plurality of site-isolated regions defined thereon. A first electrochromic material is formed above a first of the plurality of site-isolated regions using a first set of processing conditions. A second electrochromic material is formed above a second of the plurality of site-isolated regions using a second set of processing conditions. The second set of processing conditions is different than the first set of processing conditions.

In some embodiments, methods for evaluating electrochromic material processing conditions are provided. A substrate is positioned in a processing chamber. The substrate has a plurality of site-isolated regions defined thereon. A first electrochromic material is formed above a first of the plurality of site-isolated regions using a first set of processing conditions. A second electrochromic material is formed above a second of the plurality of site-isolated regions using a second set of processing conditions. The second set of processing conditions is different than the first set of processing conditions.

In some embodiments, methods for evaluating electrochromic material processing conditions are provided. A substrate is positioned in a processing chamber having at least one target positioned therein. The substrate has a plurality of site-isolated regions defined thereon, and the at least one target includes electrochromic material. The electrochromic material is sputtered from the at least one target using a first set of processing conditions such that the electrochromic material is deposited above a first of the plurality of site-isolated regions. The electrochromic material is sputtered from the at least one target using a second set of processing conditions such that the electrochromic material is deposited above a second of the plurality of site-isolated regions. The second set of processing conditions is different than the first set of processing conditions Although the foregoing examples have been described in some detail for purposes of clarity of understanding, the invention is not limited to the details provided. There are many alternative ways of implementing the invention. The disclosed examples are illustrative and not restrictive.

What is claimed:

1. A method comprising:
   providing a substrate, wherein the substrate has a plurality of site-isolated regions (SIRs) defined thereon;
   forming a first electrochromic material above a surface of a first of the plurality of SIRs using a first set of processing conditions; and
   forming a second electrochromic material above a surface of a second of the plurality of SIRs using a second set of processing conditions,
   wherein the second set of processing conditions is different than the first set of processing conditions, the processing conditions are varied in a combinatorial manner, and each of the first set of processing conditions and the second set of processing conditions comprises at least one of a chemical composition of the respective electrochromic material, a thickness of the respective electrochromic material, a temperature at which the respective electrochromic material is formed, and a processing condition associated with a gaseous environment within a processing chamber in which the respective electrochromic material is formed.

2. The method of claim 1, further comprising:
   characterizing the first electrochromic material and the second electrochromic material, wherein the characterizing the first electrochromic material and the second electrochromic material comprises testing at least one of physical properties, chemical properties, acoustic properties, magnetic properties, electrical properties, and optical properties of the first electrochromic material and the second electrochromic material; and
   selecting one of the first set of processing conditions or the second set of processing conditions based on the characterizing of the first electrochromic material and the second electrochromic material.

3. The method of claim 2, further comprising moving the substrate after the forming the first electrochromic material above the surface of the first of the plurality of SIRs and before the forming the second electrochromic material above the surface of the second of the plurality of SIRs.

4. The method of claim 3, wherein the first electrochromic material and the second electrochromic material are formed in a same processing chamber.

5. The method of claim 4, wherein the first electrochromic material and the second electrochromic material have different chemical compositions.

6. The method of claim 5, wherein the characterizing the first electrochromic material and the second electrochromic material is performed using at least one of an ellipsometer, an ultraviolet-visible (UV-VIS) spectrometer, a reflectometer, an interferometer, a scanning probe microscope, a stylus profiler, an optical profiler, a confocal laser scanning microscope, an optical microscope, an electron microscope, X-ray fluorescence (XRF), an electrochemical impedance spectrometer, hall measurements, optical transmission, an absorption tester, and an electronic tester.

7. The method of claim 6, wherein each of the first electrochromic material and the second electrochromic material comprises a metal in a d-block of the periodic table.

8. A method for evaluating electrochromic material processing conditions, the method comprising:
positioning a substrate in a processing chamber, the substrate having a plurality of site-isolated regions (SIRs) defined thereon;
forming a first electrochromic material above a surface of a first of the plurality of SIRs using a first set of processing conditions;
after the forming of the first electrochromic material above the surface of the first of the plurality of SIRs, moving the substrate within the processing chamber in a direction parallel to the surface of the first of the plurality of SIRs; and
after the moving of the substrate within the processing chamber, forming a second electrochromic material above a surface of a second of the plurality of SIRs within the processing chamber using a second set of processing conditions,
wherein the second set of processing conditions is different than the first set of processing conditions, the processing conditions are varied in a combinatorial manner, and each of the first set of processing conditions and the second set of processing conditions comprises at least one of a chemical composition of the respective electrochromic material, a thickness of the respective electrochromic material, a temperature at which the respective electrochromic material is formed, and a processing condition associated with a gaseous environment within the processing chamber during the forming of the respective electrochromic material.

9. The method of claim 8, further comprising
characterizing the first electrochromic material and the second electrochromic material, wherein the characterizing the first electrochromic material and the second electrochromic material is performed using at least one of an ellipsometer, an ultraviolet-visible (UV-VIS) spectrometer, a reflectometer, an interferometer, a scanning probe microscope, a stylus profiler, an optical profiler, a confocal laser scanning microscope, an optical microscope, an electron microscope, X-ray fluorescence (XRF), an electrochemical impedance spectrometer, hall measurements, optical transmission, an absorption tester, and an electronic tester; and
selecting one of the first set of processing conditions or the second set of processing conditions based on the characterizing of the first electrochromic material and the second electrochromic material.

10. The method of claim 9, wherein the first electrochromic material and the second electrochromic material are formed in a first processing chamber, and the method further comprises:
transporting the substrate to a second processing chamber; and
processing the first of the plurality of SIRs and the second of the plurality of SIRs in the second processing chamber.

11. The method of claim 10, wherein each of the first electrochromic material and the second electrochromic material comprises at least one of tungsten oxide, niobium oxide, molybdenum oxide, iridium oxide, titanium oxide, vanadium oxide, or a combination thereof.

* * * * *